United States Patent
Kumar et al.

(10) Patent No.: US 11,983,604 B2
(45) Date of Patent: May 14, 2024

(54) QUANTUM-INSPIRED ALGORITHMS TO SOLVE INTRACTABLE PROBLEMS USING CLASSICAL COMPUTERS

(71) Applicant: HEWLETT PACKARD ENTERPRISE DEVELOPMENT LP, Houston, TX (US)

(72) Inventors: Suhas Kumar, Milpitas, CA (US); John Paul Strachan, Milpitas, CA (US); Thomas Van Vaerenbergh, Diegem (BE)

(73) Assignee: Hewlett Packard Enterprise Development LP, Spring, TX (US)

( * ) Notice: Subject to any disclaimer, the term of this patent is extended or adjusted under 35 U.S.C. 154(b) by 426 days.

(21) Appl. No.: 17/378,650

(22) Filed: Jul. 16, 2021

(65) Prior Publication Data
US 2023/0019942 A1    Jan. 19, 2023

(51) Int. Cl.
G06N 10/00    (2022.01)
G06F 9/455    (2018.01)

(52) U.S. Cl.
CPC ............. *G06N 10/00* (2019.01); *G06F 9/455* (2013.01)

(58) Field of Classification Search
CPC ........ G06N 10/00; G06N 3/065; G06N 10/80; G06N 3/044; G06N 5/01; G06N 10/60; G06F 9/455; G06F 30/3308; G06F 30/27
See application file for complete search history.

(56) References Cited

U.S. PATENT DOCUMENTS

| | | | |
|---|---|---|---|
| 9,152,746 B2 | 10/2015 | Troyer et al. | |
| 10,755,170 B2* | 8/2020 | Gokmen | G06N 3/084 |
| 10,949,738 B1* | 3/2021 | Kumar | G06N 3/048 |
| 11,551,056 B2* | 1/2023 | Strachan | G06N 3/065 |
| 2008/0260257 A1 | 10/2008 | Rose | |
| 2013/0144925 A1 | 6/2013 | Macready et al. | |
| 2014/0028347 A1* | 1/2014 | Robinett | H03K 19/173 326/38 |
| 2018/0253642 A1* | 9/2018 | Gokmen | G06N 3/084 |
| 2019/0324943 A1 | 10/2019 | Ozfidan | |
| 2020/0242448 A1* | 7/2020 | Strachan | G06N 3/08 |
| 2020/0371974 A1 | 11/2020 | Boothby et al. | |

OTHER PUBLICATIONS

Cai, F. et al., Harnessing Intrinsic Noise in Memristor Hopfield Neural Networks for Combinatorial Optimization, Hewlett Packard Labs et al., arXiv:1903.11194 [cs.ET] (or arXiv:1903.11194v2 [cs.ET] for this version) https://doi.org/10.48550/arXiv.1903.11194, pp. 1-24. (Year: 2019).*

(Continued)

*Primary Examiner* — Stacy Whitmore
(74) *Attorney, Agent, or Firm* — Sheppard Mullin Richter & Hampton LLP

(57) ABSTRACT

Systems and methods are configured to provide a first problem to be solved to a network of memristors. A second problem to be solved can be gradually provided to the network of memristors. Controlled noise can be applied to the network of memristors for at least a portion of time during which the second problem is "gradually" provided to the network of memristors. A solution to the second problem can be determined.

20 Claims, 9 Drawing Sheets

(56) References Cited

OTHER PUBLICATIONS

Dema, B. et al., "Support Vector Machine for Multiclass Classification using Quantum Annealers," DEIM Forum, 2020, https://proceedings-of-deim.github.io/DEIM2020/papers/F3-4.pdf; 6 pgs.

Liu, J. et al., "Adiabatic Quantum Computation Applied to Deep Learning Networks," Entropy (Basel), May 18, 2018, 28 pgs., vol. 20, Issue 5, https://pdfs.semanticscholar.org/51d3/747b941be86f6e9b4fa27cc682e2a1a0d559.pdf?_ga=2.233707486.1970012769.1612165283-79997752.1605250358.

Wang, B. et al., "Optimization of Quantum Computing Models Inspired by D-Wave Quantum Annealing," Tsinghua Science & Technology, Aug. 2020, 8 pgs., vol. 25, No. 4, https://ieeexplore.ieee.org/stamp/stamp.jsp?arnumber=8954869.

\* cited by examiner

QUANTUM-INSPIRED ALGORITHMS TO SOLVE INTRACTABLE PROBLEMS USING CLASSICAL COMPUTERS

FIELD

Embodiments of the present disclosure relate to simulating quantum computing on a classical (e.g., non-quantum) computer. Further, embodiments of the present disclosure relate to implementing quantum-inspired algorithms on the classical computer.

BACKGROUND

For years, the computing world has tackled many intractable problems for which there exist no efficient algorithms to solve them. The intractable problems can be quadratic unconstrained binary optimization (QUBO) problems and/or NP-hard problems. Some example intractable problems include, to name a few, as viral mutation detection, genome sequencing, constrained scheduling, etc. Efficiently solving any of these very important problems may fundamentally change the world we live in. There have been efforts to solve such intractable problems using probabilistic algorithms that may not give us an exact solution but efficiently provide a sufficiently acceptable solution. Unfortunately, classical computing hardware have not been well-suited to implement such probabilistic algorithms.

Quantum computing (e.g., quantum computers and quantum algorithms) has promised itself as, in theory, potentially capable of providing solutions to intractable problems with incredible speed-ups. However, while quantum computing may yet deliver its promises, various challenges have prevented quantum computing from making significant progress. For example, current quantum computers suffer from the cryogenic cooling needs at extreme temperatures and scalability challenges. So far, quantum computing has not delivered its promises at real-world scales.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
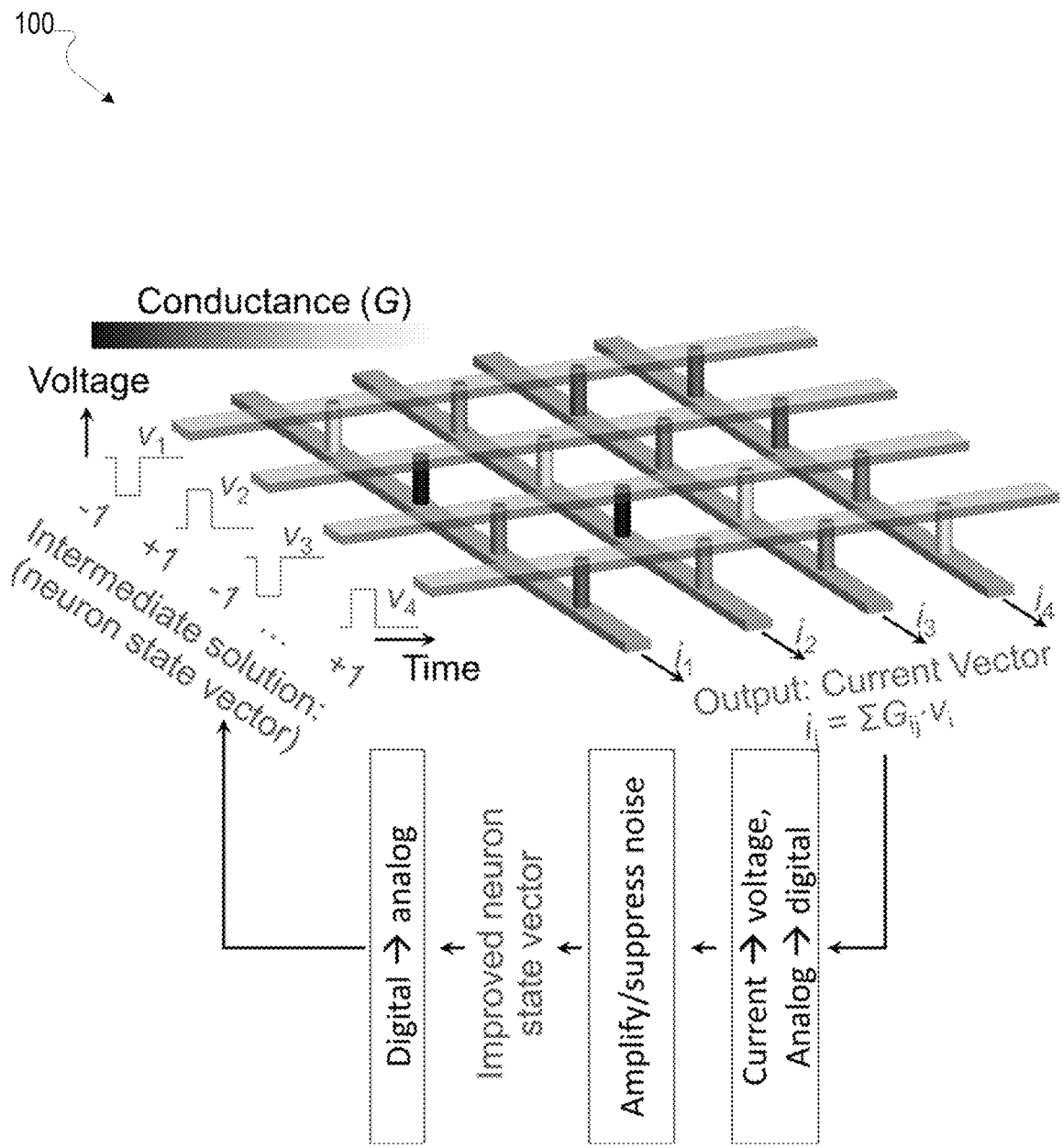
FIG. 1 is an exemplary memristor-based computing element that can implement quantum-inspired algorithms, according to embodiments of the present disclosure.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION

As described, previous approaches of solving intractable problems involved using adiabatic quantum annealing with super-conducting qubits on a quantum computer. Despite contrary ambitions, quantum annealers have not been shown to provide speed-ups for industrial applications at the least because of high costs and deployment complexity relating to cryogenic cooling.

The present disclosure provides an alternate answer to quantum computing. Specifically, the present disclosure provides a memristor-based computing element (e.g., non-quantum computing element) that can leverage the discussed probabilistic techniques and quantum-inspired algorithms to solve the intractable problems. The memristor-based computing element can exhibit many of advantages that are traditionally associated with quantum computing without its challenges. For instance, the memristor-based computing element can execute quantum-inspired algorithms that can provide very significant speed-ups in solving intractable problems. A Hopfield Neural Network (HNN) implemented with a network of memristors can be one such non-quantum computing element.

FIG. 1 is an exemplary memristor-based computing element 100 that can implement quantum-inspired algorithms, according to embodiments of the present disclosure. More specifically, the exemplary memristor-based computing element 100 can be a HNN although the present disclosure contemplates other types of memristor-based computing elements. A HNN is a fully-connected recurrent neural network without self-feedback, where a state of a neuron is dependent on the input received from all other neurons.

The HNN can be used to solve intractable problems due to its capability to dynamically find minima (global or local) of cost-functions. An intractable problem can be encoded in one or more matrices (e.g., Hamiltonian matrices) representing a set of objectives and/or constraints of the problem. Outputs of the cost-functions can be associated with an energy level in which the lowest energy can indicate a possible solution. Accordingly, the memristor-based computing element 100 can enable implementation of quantum-inspired algorithms for solving the intractable problems.

The present disclosure provides variety of improvements over conventional approaches, including: (i) adiabatic annealing via problem difficulty, (ii) adiabatic annealing via problem size, (iii) quantum-inspired annealing for a sequence of multiple problems, and (iv) reverse annealing to enable high-efficiency quantum-inspired solutions to problem sequences. Each improvement will be described in greater detail throughout the present disclosure.

Figure 2:
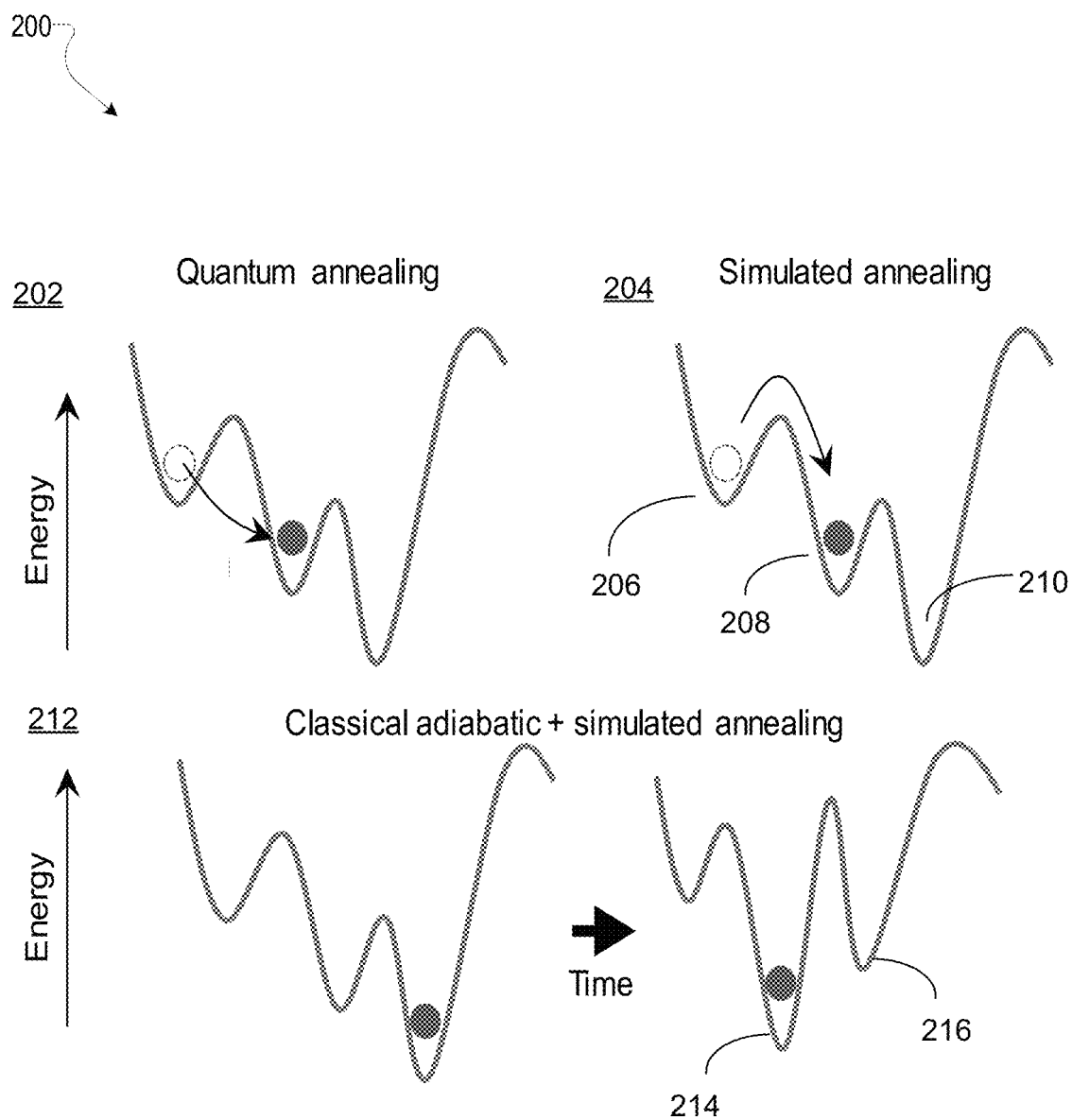
FIG. 2 illustrates a schematic of a solution scheme inspired from quantum computing, according to embodiments of the present disclosure.

FIG. 2 illustrates a schematic 200 of a solution scheme 212 inspired from quantum computing, according to embodiments of the present disclosure. The solution scheme mimics quantum annealing 202 conventionally performed on a quantum computer with simulated annealing 204 on a non-quantum computing element. Further, the solution scheme 212 combines classical adiabatic with simulated annealing 204 to provide solutions to intractable problems that can be implemented on a non-quantum computing element (e.g., the memristor-based computing element 100 of FIG. 1).

As illustrated, quantum annealing 202 is a process in which a global minimum of a given objective function can be found using quantum tunneling phenomenon. The quantum tunneling phenomenon enables a wavefunction to propagate through a potential barrier to stabilize at a lower local minimum that corresponds to a lower energy state. In quantum annealing 202, a probability that the new local minimum is the global minimum can be increased through quantum tunneling and finding a new local minimum.

Simulated annealing 204 can mimic quantum annealing 202 on the non-quantum computing element through introduction of perturbations. The perturbations can help the non-quantum computing element to simulate quantum tunneling of a quantum computer. For instance, the perturbations can cause a system in a stabilized state (e.g., a local minimum energy level) 206 to get excited such that the system transitions to a new stable state (e.g., a new local minimum energy level) 208. In a sense, the perturbations can be analogized to shaking the system. Thus, simulated annealing 204 can help find a new local minimum that has greater probability of being a global minimum 210, just like quantum annealing 202. More details on the perturbations are provided with regard to FIG. 5.

Adiabatic algorithms and the simulated annealing 204 can be combined to provide the solution scheme 212. The solution scheme 212 can find a global minimum of a problem using quantum-inspired algorithms implemented on the non-quantum computing element. An adiabatic algorithm is an algorithm that finds a solution to a problem by gradually (slowly) changing external conditions of a system such that the system can adapt its form and stabilize in a solution state (e.g., a state with lowest energy level) 214 over a time period. This is in contrast to rapidly changing the external conditions such that there is insufficient time for the form to adapt to the solution state 214. In other words, if the changes of the external conditions were too sudden, the system may remain in a state that is closer to a previous state 216 and fail to reach the solution state 214 that it would otherwise reach if the changes were gradual.

The adiabatic algorithm can be adapted for use on the non-quantum computing element to solve a problem. As alluded, the adiabatic algorithm can be adapted based on (i) problem difficulty or (ii) problem size.

Adiabatic Annealing Via Problem Difficulty

Figure 3A:
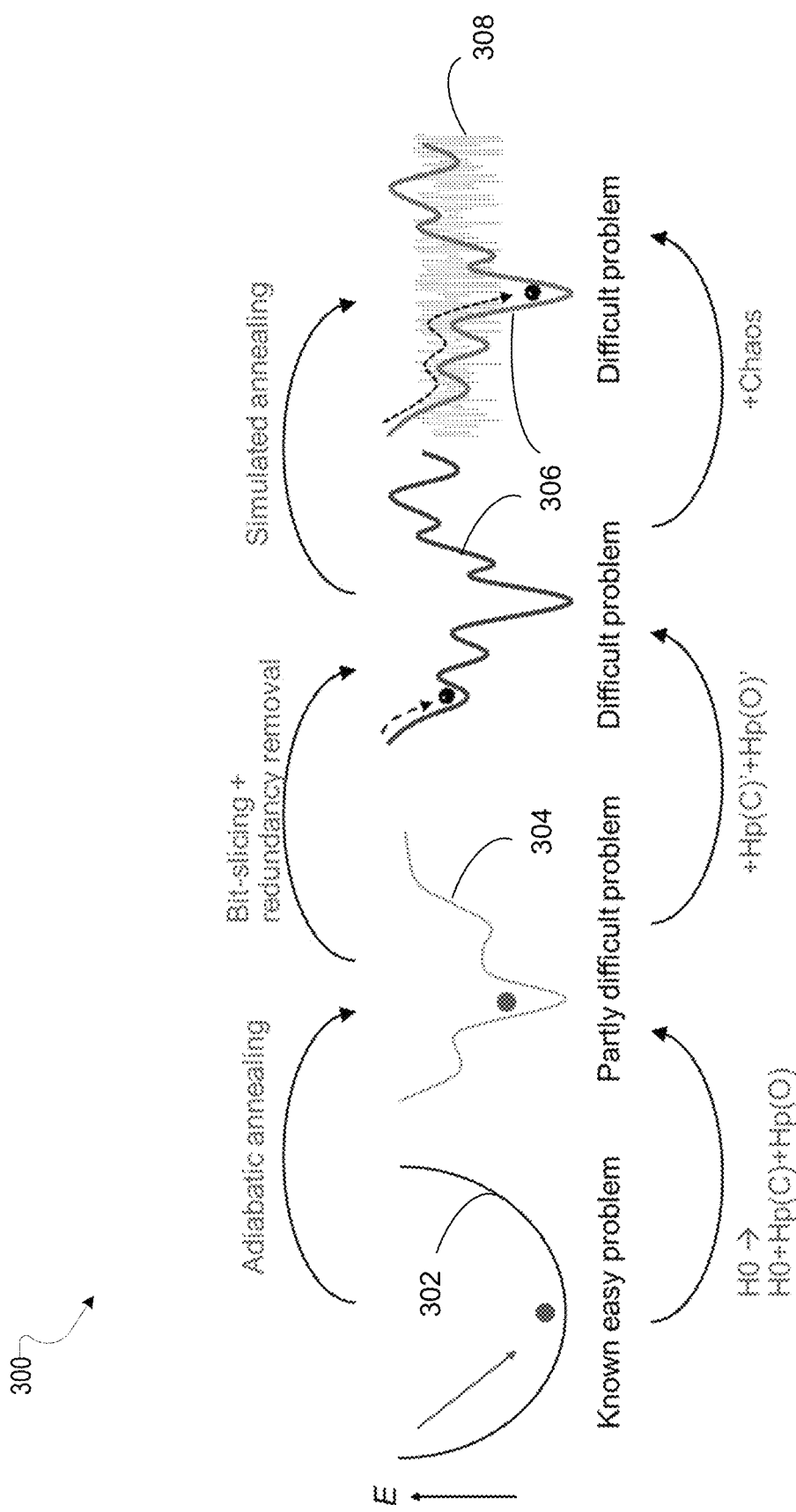
FIG. 3A illustrates a scheme of solving a problem by gradually increasing difficulty of the problem, according to embodiments of the present disclosure.

FIG. 3A illustrates a scheme 300 of solving a problem by gradually increasing difficulty of the problem, according to embodiments of the present disclosure. The scheme 300 can implement an adiabatic algorithm on a non-quantum computing element (e.g., the memristor-based computing element 100 of FIG. 1). Initially, an easy problem 302 can be provided (e.g., introduced) to the non-quantum computing element. The easy problem 302 can be a problem that is known to be simple. For instance, the scheme 300 illustrates the easy problem 302 as a simple curve for which it would be simple to determine a solution (e.g., a global minimum/lowest energy state). In some embodiments, an easy problem 302 can be a problem with a known solution. For instance, an easy problem can be a complex problem but a problem for which a global minimum is already determined.

Gradually, the adiabatic algorithm can provide a more difficult problem, such as a partly difficult problem 304, to the non-quantum computing element. For instance, the scheme 300 illustrates the partly difficult problem 304 that has three local minima for which it would be more challenging to find a global minimum. In some embodiments, the partly difficult problem 304 can get its increased difficulty from a partial introduction of a difficult problem 306 on the easy problem 302. During the provision of the partly difficult problem 304, the adiabatic algorithm continues finding a global minimum.

Eventually, the adiabatic algorithm can provide the difficult problem 306 to the non-quantum computing element. Thus, the scheme 300 illustrates solving a problem by gradually increasing difficult of the problem with through the easy problem 302, the partly difficult problem 304, and the difficult problem 306. In some embodiments, the easy problem 302, the partly difficult problem 304, and the difficult problem 306 can be of a same problem that can be divided into varying degrees of difficulty. In some other embodiments, the problems 302, 304, 306 can each correspond to a first problem with a known solution, the first problem with partial introduction of a second problem without a known solution, and the second problem.

The scheme 300 further illustrates simulated annealing (e.g., the simulated annealing 204 of FIG. 2) applied on the difficult problem 306. In some instances, the adiabatic algorithm alone may not be sufficient to find a solution (e.g., a global minimum). As described, perturbations 308 can be applied to the non-quantum computing element to cause simulated annealing, which can help find the global minimum. More details on the perturbations are provided with regard to FIG. 5.

Adiabatic Annealing Via Problem Size

Figure 3B:
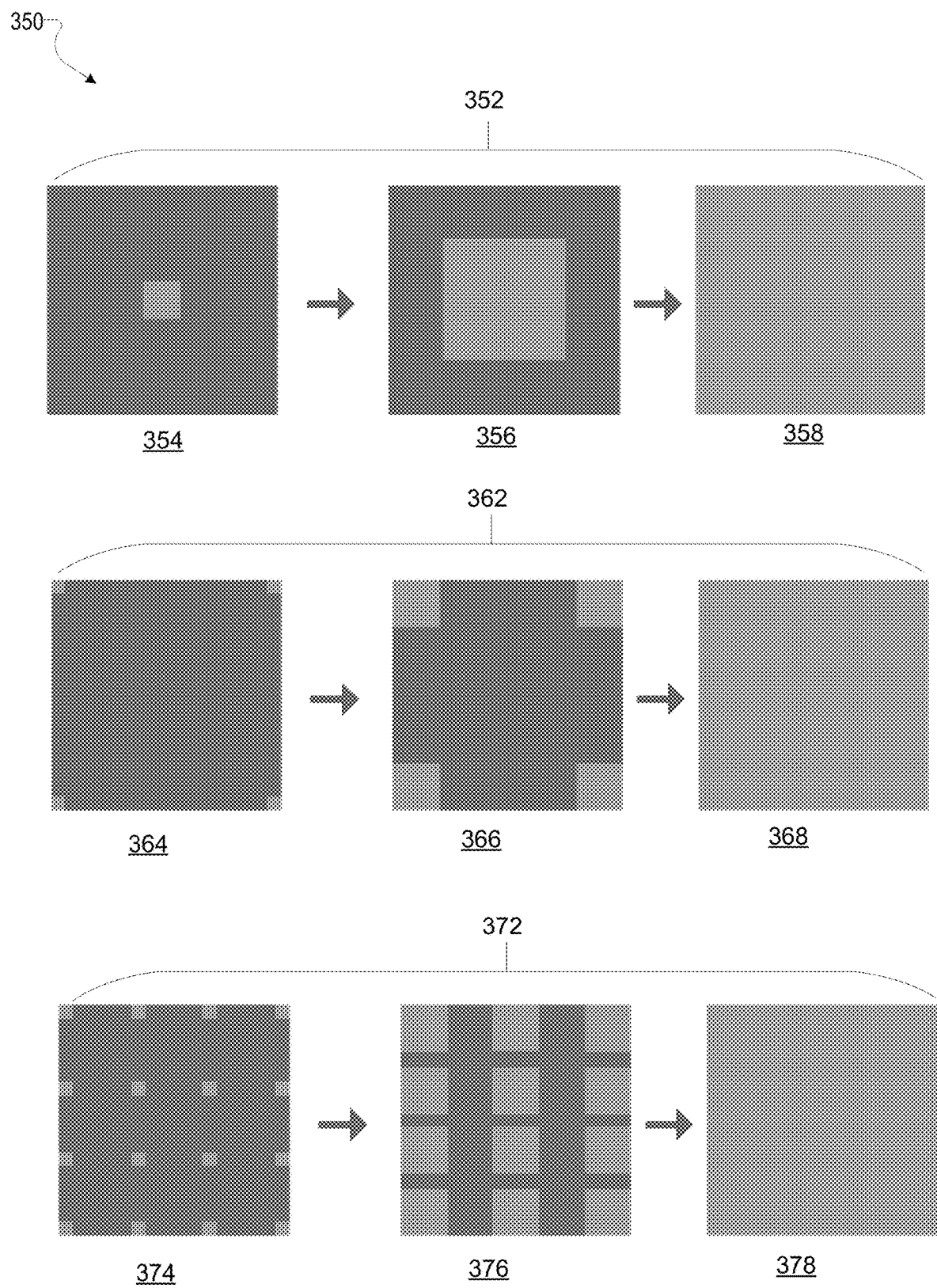
FIG. 3B illustrates exemplary schemes of solving a problem by dividing the problem into smaller subsets of the problem, according to embodiments of the present disclosure.

FIG. 3B illustrates exemplary schemes 352, 362, 372 of solving a problem 358, 368, 378 by dividing the problem 358, 368, 378 into smaller subsets of the problem, according to embodiments of the present disclosure. The smaller subsets can each have a problem size that is smaller than a problem size of the problem. The exemplary schemes 352, 362, 372 each illustrate three boxes which represent a weights matrix or Hamiltonian. The rightmost boxes 358, 368, 378 each represents a final problem to be solved. In each of the schemes 352, 362, 372, lighter portions of boxes 354, 356, 364, 366, 374, 376 represent parts of the final problems 358, 368, 378 that are not yet solved.

In each of the schemes 352, 362, 372, the first step is to consider one or more subsets (e.g., darker portions of the boxes 354, 364, 374, 376) of the final problems 358, 368, 378. The subsets can divide the final problems 358, 368, 378 into more manageable and smaller problems. As illustrated in middle boxes 356, 366, 376 of the schemes 352, 362, 372, adiabatic algorithms can gradually increase sizes of the subsets. Thus, the subsets can represent intermediate problems for which solving them may speed-up the solution to the final problems 358, 368, 378 by providing a good initial conditions for the answer corresponding to the final problems 358, 368, 378.

The adiabatic annealing via problem difficulty described in relation to FIG. 3A and the adiabatic annealing via problem size described in relation to FIG. 3B are not mutually exclusive and can be combined in some instances. For example, a small subset of a problem is likely to be easier to solve than the larger whole problem and, thus, adiabatic annealing via problem size can involve adiabatic annealing via difficulty, and vice versa.

Quantum-Inspired Annealing for a Sequence of Multiple Problems

Figure 4:
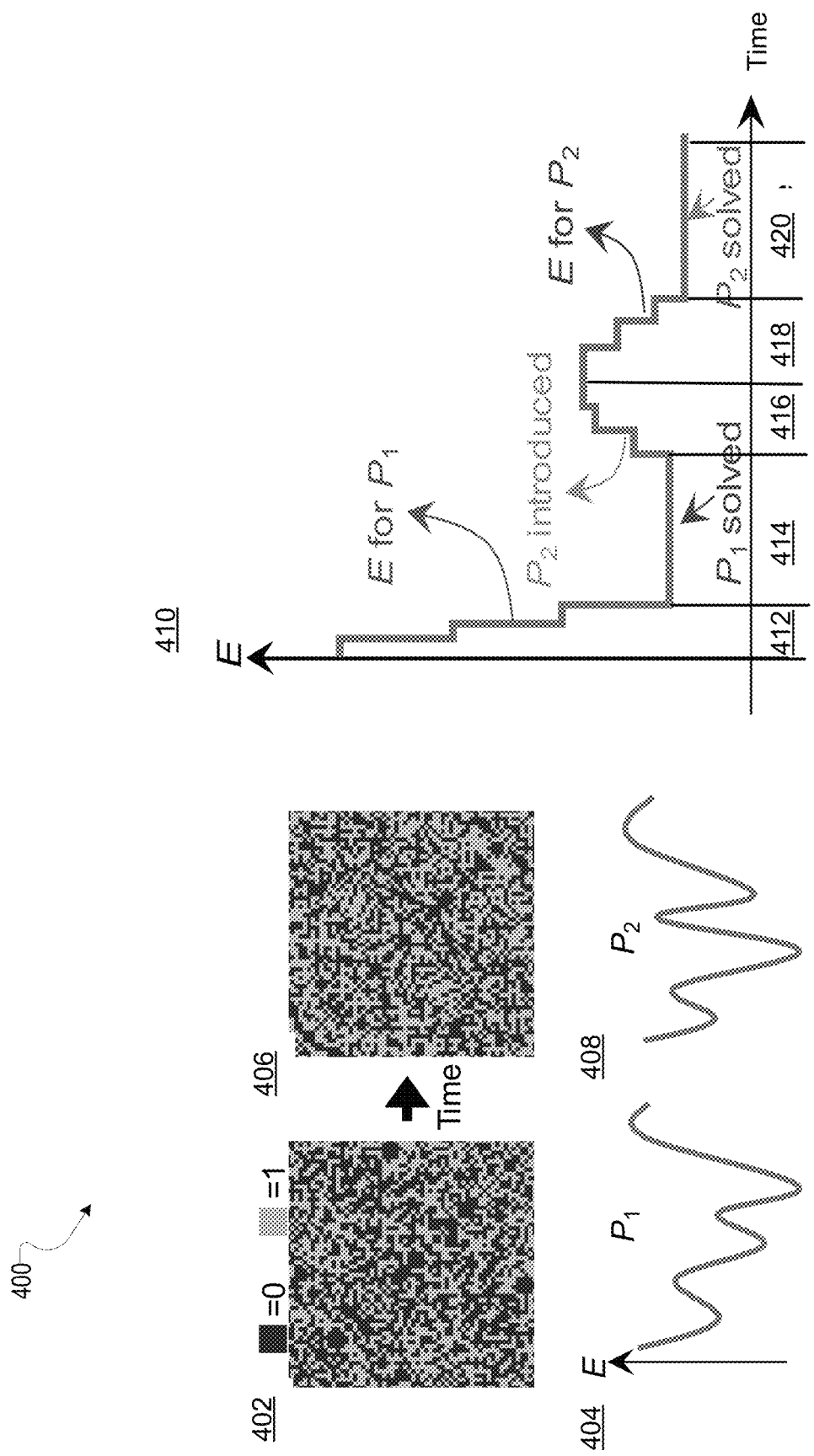
FIG. 4 illustrates a scheme for solving multiple problems in sequence, according to embodiments of the present disclosure.

FIG. 4 illustrates a scheme 400 for solving multiple problems in sequence, according to embodiments of the present disclosure. The scheme 400 can multiple problems using adiabatic annealing process. While the scheme 400 illustrates two problems (e.g., a first problem and a second problem each represented with corresponding matrix forms 402, 406 and energy forms 404, 408), the scheme 400 can be expanded to solve any number of problems in a sequence.

In real world, there are many instances in which a sequence of intractable problems need to be solved in sequence (e.g., in a back-to-back manner). For instance, cable broadcasting and financial investments can involve solving a string of problems in sequence, where each problem is important. In cable broadcasting, a broadcaster may desire to optimize bandwidth allocation between multiple channels. The broadcaster may allocate small bandwidth for a news channel in which only lips of a news reporter change significantly. On the other hand, the broadcaster may allocate greater bandwidth for a sports channel in which there are dynamic movements across multiple regions in a short time period. Allocation of bandwidth to different channels need to be computed moment to moment based on amount of changes in both channels. Further, consider allocating funds in a market with a set amount of available funds. The funds need to be invested and divested based on changes in values of underlying financial instruments. Constraints and objectives of such problems change in real-time, providing a new problem to be solved. Solving such problems in sequence can be analogized to solving a string of problems in sequence.

In solving the string of problems where each problem is of interest, the scheme 400 can use adiabatic annealing process to reduce the total time to solve the problems. As a time-energy graph 410 illustrates, a non-quantum computing element (e.g., the memristor-based computing element 100 of FIG. 1) can solve the first problem ($P_1$ represented by the matrix form 402 and energy form 404) over a first time period 412 to determine a solution (e.g., the lowest energy level of the first time period 412). After the first problem is solved, as indicated over a second time period 414, the second problem ($P_2$ represented by the matrix form 406 and energy form 408) can be gradually introduced over a third time period 416. The gradual introduction of the second problem can be consistent with adiabatic annealing process that utilizes a solution to the first problem (e.g., the lowest energy level) as an initial condition for the second problem. The non-quantum computing element can solve the second problem over a fourth time period 418 using the initial condition. As indicated over a fifth time period 420, the second problem can be solved.

The gradual introduction of the second problem to the first problem according to the adiabatic annealing process can meaningfully reduce compute time for solving the second problem. For instance, the time-energy graph 410 indicates that an initial condition for the first problem (i.e., an energy level at t=0) is at a much higher level than an initial condition for the second problem (i.e., a solution to the first problem, the lowest energy level during the second time period 414). Thus, the solution to the first problem can provide an initial condition that is closer to a solution to the second problem (i.e., the lowest energy level during the fifth time period 420) and, thus, can meaningful reduce compute time for the second problem. When there are numerous problems to be solved in a sequence, the reduction in aggregated compute time can be significant as each compute time for a problem other than the first problem can benefit from solutions of the previous problems.

In some embodiments, the gradual introduction of the second problem to the first problem can involve gradual transition from the first problem to the second problem. For example, at the beginning of the third time period 416, the first problem is 100% and the second problem is 0% (e.g., the second problem is yet to be introduced). Throughout the third time period 416, and potentially some portions of the fourth time period 418, a ratio between the first problem and the second problem can gradually change from 100:0 to 80:20, 60:40, 40:60, 20:80, and to, ultimately, 0:100. An example formula that can represent a transitional problem (P) during the introduction of the second problem ($P_2$) to the first problem ($P_1$) can be:

$$P = \frac{1}{t_{ann} - t_0}[P_1(t_{ann} - t_k) + P_2(t_k - t_0)], \quad [\text{Eq. 1}]$$

$$\text{for } t_0 < t_k < t_{ann}$$

where $t_0$ is the initial time at which the second problem is introduced (e.g., at the start of the third time period 416), $t_{ann}$ is transition completion time (e.g., a time between the third time period 416 and the fourth time period 418), and $t_k$ is a time in between.

A network of memristors (e.g., the memristor-based computing element 100 of FIG. 1) is well-suited to enable the gradual transition. A memristor can be any two-terminal device that can store information, either in a volatile or nonvolatile way, in its resistance as a response to applied electrical currents/voltages. Unlike traditional memory elements that store discrete values (e.g., 0 or 1), memristors are capable of storing intermediate values (e.g., 0.2583, 0.84793, $$\frac{\pi}{4},$$

or the like). Thus, the network of memristors can manage gradual transition between problems, such as problems represented by matrices (e.g., $P_1$ matrix 402 and $P_2$ matrix 406). Further, the network of memristors can provide for change of individual pixel (e.g., a value stored on a single memristor) in a random access manner unlike FLASH-based memory. Thus, the network of memristors can manage transitional states between problems. Further, the network of memristors can be well-suited to perform energy minimization, including energy minimization via annealing.

Figure 5:
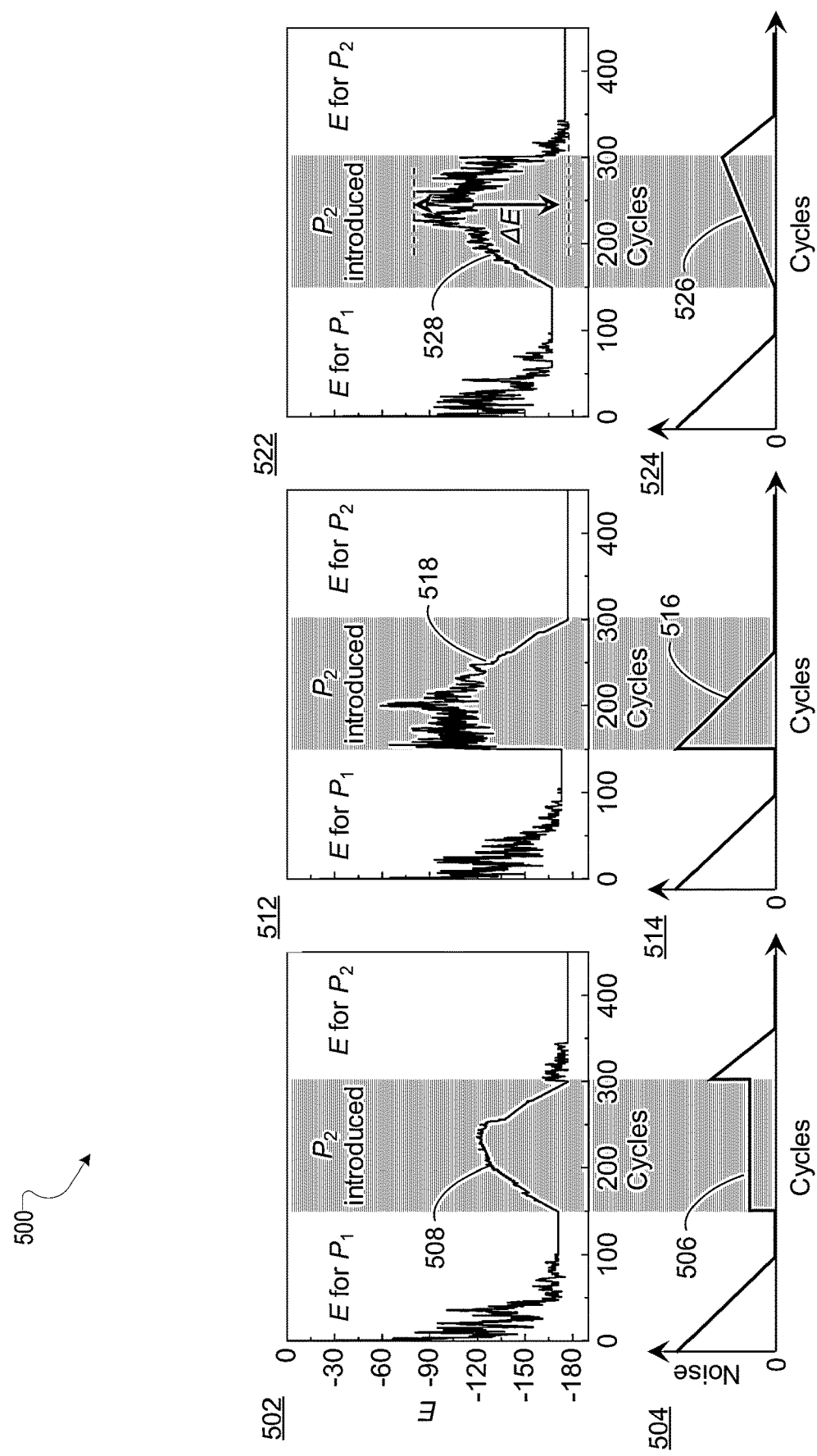
FIG. 5 illustrates schemes for reverse annealing that introduces controlled perturbations into a memristor-based computing element, according to embodiments of the present disclosure.

Reverse Annealing to Enable High-Efficiency Quantum-Inspired Solutions to Problem Sequences FIG. 5 illustrates schemes 500 for reverse annealing that introduces controlled perturbations into a memristor-based computing element, according to embodiments of the present disclosure. Energy profiles 502, 512, 522 illustrate changing energy levels as can be observed for solving problems in a sequence (e.g., solving the first problem $P_1$ followed by the second problem $P_2$ in FIG. 4). Each of the energy profiles 502, 512, 522 illustrates a time-energy graph (e.g., the time-energy graph 410 of FIG. 4). FIG. 5 further illustrates different noise profiles 504, 514, 524 that are applied to each of the corresponding energy profiles 502, 512, 522. The noise profile can be applied to a non-quantum computing element (e.g., the memristor-based computing element 100 of FIG. 1) to cause perturbations (e.g., the perturbations 308 of FIG. 3) on the non-quantum computing element.

The introduction of perturbations to the non-quantum computing element through controlled noise profiles 504, 514, 524 can condition the non-quantum computing element to better handle a new problem. Each of noise profiles 504, 514, 524 illustrate different levels of perturbations at different times (e.g., the time periods 412, 414, 416, 418, 420 of FIG. 4). For instance, a first noise profile 504 illustrates a constant noise level 506 during introduction of a second problem. A second noise profile 514 illustrates a gradually decreasing noise level 516 during introduction of a second problem. A third noise profile 524 illustrates a gradually increasing noise level 526 during introduction of a second problem.

The controlled introduction of a noise profiles 504, 514, 524 can facilitate simulated annealing (e.g., the simulated annealing 204 of FIG. 2). The simulated annealing can help simulate quantum annealing of a quantum computer on the non-quantum computing element. In other words, the perturbations can help avoid the non-quantum computing element from getting stuck in a local minimum that is not a global minimum. For instance, the initial common high noise level of the noise profiles 504, 514, 524 applied to a first problem (e.g., left light portions of the energy profiles 502, 512, 522) can help the non-quantum computing element quickly escape local minima to arrive at solutions represented by respective a global minima. Later, noise levels are reduced to prevent further undesired simulated annealing once the respective global minima are found.

The present disclosure further contemplates "reverse annealing". Reverse annealing can be considered as applying increasing noise level 526 illustrated in the third noise profile 524 during gradual introduction of the second problem. The reverse annealing increases noise level such that the non-quantum computing element can facilitate transition from a solution state of a first problem (e.g., an initial condition before an introduction of the second problem) to a solution state of a second problem. The present disclosure has observed that reverse annealing can meaningfully improve accuracy of solutions and reduce compute time for a sequence of problems. While a constantly increasing noise level 526 is illustrated in the third noise profile 524, it is contemplated that other types of noise levels including logarithmic, geometrical, step functions, or other noise profiles can also be used to apply the reverse annealing.

Figure 6:
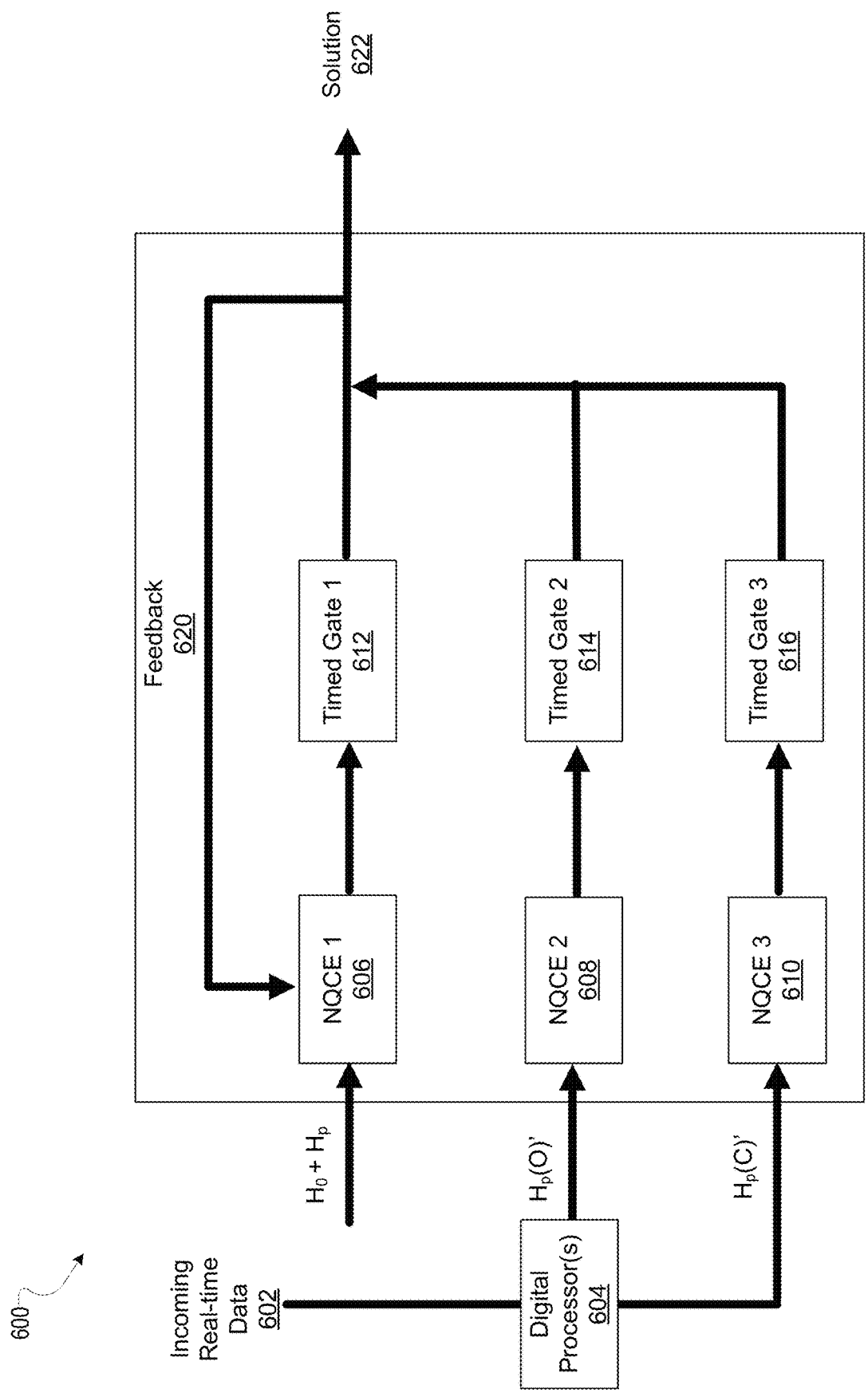
FIG. 6 illustrates an exemplary non-quantum computing system that can implement solution schemes, according to embodiments of the present disclosure.

FIG. 6 illustrates an exemplary non-quantum computing system 600 that can implement solution schemes, according to embodiments of the present disclosure. The exemplary non-quantum computing system 600 can comprise one or more digital processors 604, one or more non-quantum computing elements (NQCEs) 606, 608, 610, and one or more timed gates 612, 614, 616. A NQCE can be a HNN, dot product engine (DPE), or other computing element that can perform energy minimization, including energy minimization via annealing. The exemplary non-quantum computing system 600 can receive incoming real-time data 602 and compute a solution 622.

A first NQCE 606 can receive a problem or a series of problems according to solution schemes described with regard to FIGS. 3A, 3B, 4. When the first NQCE 606 is configured to solve one problem, under the scheme 300 of FIG. 3A which solves a problem by gradually increasing difficulty of a problem, a first problem (a first Hamiltonian, $H_0$) can be a simple portion of a problem and a second problem (a second Hamiltonian, Hp) can be a more complex portion of the problem. Similarly, under the schemes 350 which solve a problem by dividing the problem into smaller subsets of the problem, the first problem ($H_0$) can be a small subset of a problem and the second problem (Hp) can be a larger subset of the problem. When the first NQCE 606 is configured to solve a series of problems, under the scheme 400 of FIG. 4, the first problem ($H_0$) and the second problem (Hp) can be different problems in a sequence. Aspects of the schemes 300, 350, 400 can be combined, as appropriate, to structure the first problem ($H_0$) and the second problem (Hp) for adiabatic annealing processes.

The first NQCE 606 can perform linear summation of the first problem ($H_0$) and the second problem (Hp). In an adiabatic annealing process, the second problem (Hp) can be gradually introduced to the first problem ($H_0$).

The second problem (Hp) can be split into a constraint portion and an objective portion of the second problem (Hp). For example, the second problem (Hp) can be split into a constraint Hamiltonian matrix (Hp(C)) and an objective Hamiltonian matrix (Hp(O)). Further, as incoming real-time data 602 changes the second problem (Hp), the real-time data can be split into an updated constraint Hamiltonian matrix (Hp(C)') and an updated objective Hamiltonian matrix (Hp(O)').

As an example, consider an airplane routing problem that visits multiple cities. An objective can be finding a path that has minimum travel distance. Another objective can be finding a path that has minimum flight time. Yet another objective can finding a path that requires minimum amount of fuel. Yet another objective can be finding a path that provides maximum profit. A constraint can be a bad weather condition between two particular cities. Another constraint can be changing wind conditions.

In some embodiments, the second problem (Hp) can be split into two or more Hamiltonians based on criteria other than objectives and constraints. For example, the second problem (Hp) can be split based on problem difficulty (e.g., FIG. 3A), problem size (e.g., FIG. 3B), problem complexity, solving convenience, or the like. In some instances, the second problem (Hp) can be split randomly.

The digital processor(s) 604 can split the incoming real-time data 602 into the updated constraint Hamiltonian matrix (Hp(C)') and the updated objective Hamiltonian matrix (Hp(O)'). The updated constraint Hamiltonian matrix (Hp(C)') can be provided to a second NQCE 608 and the updated objective Hamiltonian matrix (Hp(O)') can be provided to a third NQCE 610. In some embodiments, one of the objective Hamiltonian matrix (Hp(O)) or the constraint Hamiltonian matrix (Hp(C)) can be updated based on received real-time data but not the other based on the received real-time data. The second NQCE 608 and/or the third NQCE 610 can perform adiabatic annealing of respective received matrices. Further, as described, perturbations can be introduced to NQCEs 606, 608, 610 to effectuate adiabatic annealing and reverse annealing as described with regard to FIG. 5.

In some embodiments, the exemplary non-quantum computing system 600 can include timed gates 612, 614, 616 to control influence of respective NQCEs 606, 608, 610. For instance, when all the timed gates 612, 614, 616 are open, the timed gates 612, 614, 616 can provide each NQCE 606, 608, 610 time to solve a problem each NQCE 606, 608, 610 is currently solving while preventing influence of further changes. When a second timed gate 614 is closed, the updated objective Hamiltonian matrix (Hp(O)') can be involved in the adiabatic annealing process and influence the solution 622. Similarly, when a third gate 616 is closed, the updated constraint Hamiltonian matrix (Hp(C)') can be involved in the adiabatic annealing process and influence the solution 622. With the timed gates 612, 614, 616, the exemplary non-quantum computing system 600 can control application of, or speed (e.g., rapid or slow) of the application of, the adiabatic annealing process as well as moderating importance of objective and/or constraints on the solution 620.

Figure 7:
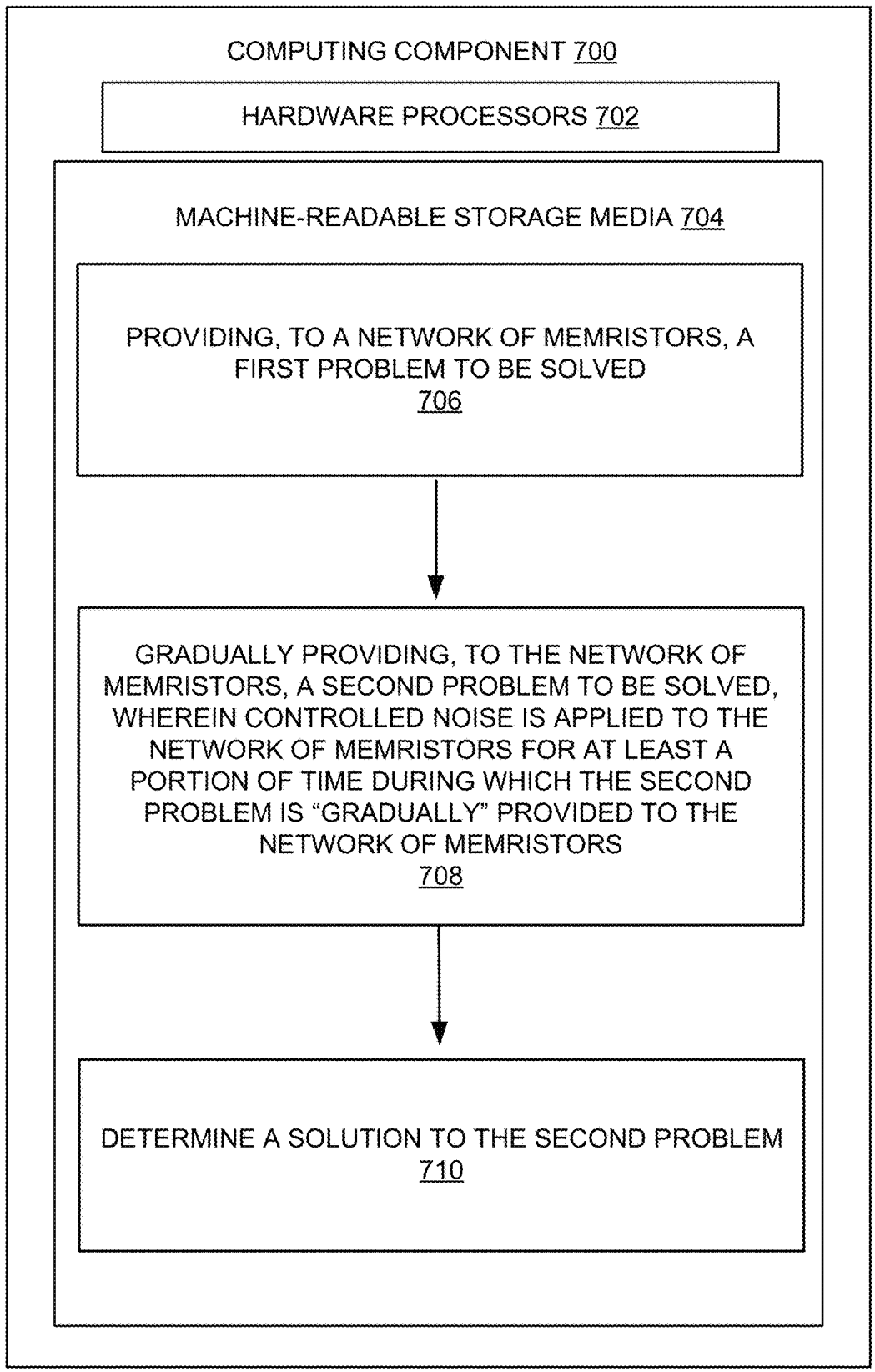
FIG. 7 depicts a set of executable instructions stored in machine-readable storage media that, when executed, cause a non-quantum computing system to perform an illustrative method for solving intractable problems, according to embodiments of the present disclosure.

FIG. 7 depicts a computing component 700 that includes one or more hardware processors 702 and machine-readable storage media 704 storing a set of machine-readable/machine-executable instructions that, when executed, cause a non-quantum computing system to perform an illustrative method for solving intractable problems, according to embodiments of the present disclosure. The computing component 700 may be, for example, the computing system 700 depicted in FIG. 7 or another computing device described herein. The hardware processors 702 may include, for example, the processor(s) 804 depicted in FIG. 8 or any other processing unit described herein. The machine-readable storage media 704 may include the main memory 806, the read-only memory (ROM) 808, the storage 810, or any other suitable machine-readable storage media described herein.

Hardware processor 702 may be one or more central processing units (CPUs), semiconductor-based microprocessors, and/or other hardware devices suitable for retrieval and execution of instructions stored in machine-readable storage medium 704. Hardware processor 702 may fetch, decode, and execute instructions, such as instructions 706-710. As an alternative or in addition to retrieving and executing instructions, hardware processor 702 may include one or more electronic circuits that include electronic components for performing the functionality of one or more instructions, such as a field programmable gate array (FPGA), application specific integrated circuit (ASIC), a memristor-based computing element (e.g., the memristor-based computing element 100 of FIG. 1), or other electronic circuits.

A machine-readable storage medium, such as machine-readable storage medium 704, may be any electronic, magnetic, optical, or other physical storage device that contains or stores executable instructions. Thus, machine-readable storage medium 704 may be, for example, Random Access Memory (RAM), non-volatile RAM (NVRAM), an Electrically Erasable Programmable Read-Only Memory (EEPROM), a storage device, an optical disc, a memristor-based computing element (e.g., the memristor-based computing element 100 of FIG. 1), and the like. In some embodiments, machine-readable storage medium 704 may be a non-transitory storage medium, where the term "non-transitory" does not encompass transitory propagating signals. As described in detail below, machine-readable storage medium 704 may be encoded with executable instructions, for example, instructions 706-710.

At block 706, in example embodiments, instructions may be executed by the hardware processors 702 to provide a first problem to be solved to a network of memristors.

At block 708, in example embodiments, instructions may be executed by the hardware processors 702 to gradually provide a second problem to be solved to the network of memristors. Controlled noise can be applied to the network of memristors for at least a portion of time during which the second problem is "gradually" provided to the network of memristors.

At block 710, in example embodiments, instructions may be executed by the hardware processors 702 to determine a solution to the second problem.

Figure 8:
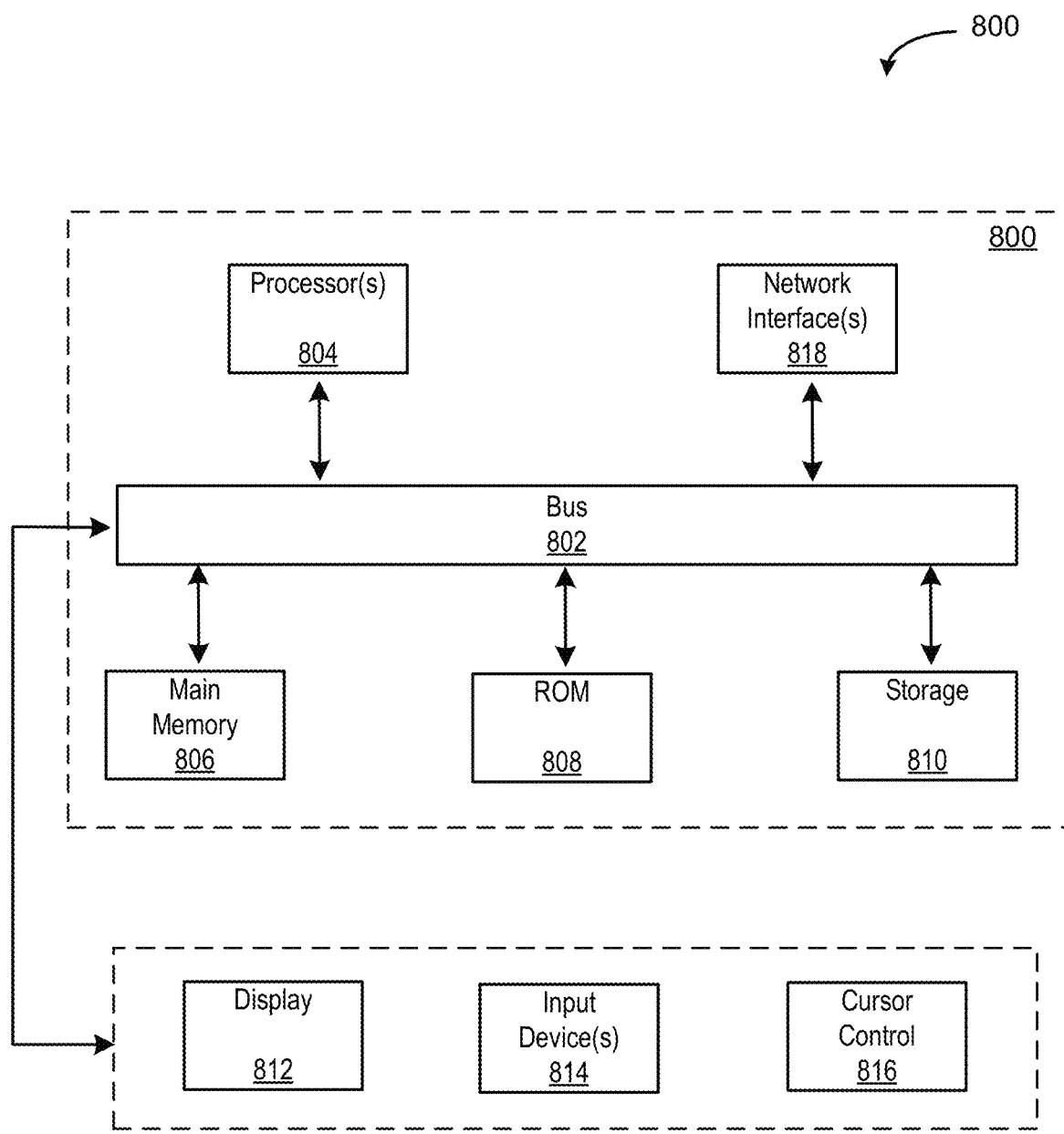
FIG. 8 is an example computing component that may be used to implement various features of embodiments described in the present disclosure.

FIG. 8 depicts a block diagram of an example computer system 800 in which various of the embodiments described herein may be implemented. The computer system 800 includes a bus 802 or other communication mechanism for communicating information, one or more hardware processors 804 coupled with bus 802 for processing information. Hardware processor(s) 804 may be, for example, one or more general purpose microprocessors.

The computer system 800 also includes a main memory 806, such as a random access memory (RAM), cache and/or other dynamic storage devices, coupled to bus 802 for storing information and instructions to be executed by processor 804. Main memory 806 also may be used for storing temporary variables or other intermediate information during execution of instructions to be executed by processor 804. Such instructions, when stored in storage media accessible to processor 804, render computer system 800 into a special-purpose machine that is customized to perform the operations specified in the instructions.

The computer system 800 further includes a read only memory (ROM) 808 or other static storage device coupled to bus 802 for storing static information and instructions for processor 804. A storage device 810, such as a magnetic disk, optical disk, or USB thumb drive (Flash drive), etc., is provided and coupled to bus 802 for storing information and instructions.

The computer system 800 may be coupled via bus 802 to a display 812, such as a liquid crystal display (LCD) (or touch screen), for displaying information to a computer user. An input device 814, including alphanumeric and other keys, is coupled to bus 802 for communicating information and command selections to processor 804. Another type of user input device is cursor control 816, such as a mouse, a trackball, or cursor direction keys for communicating direction information and command selections to processor 804 and for controlling cursor movement on display 812. In some embodiments, the same direction information and command selections as cursor control may be implemented via receiving touches on a touch screen without a cursor.

The computing system 800 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

Any of the aforementioned engines or modules can be embodied as a computing component of the computing system 800.

In general, the word "component," "engine," "system," "database," data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

The computer system 800 may implement the techniques described herein using customized hard-wired logic, one or more ASICs or FPGAs, firmware and/or program logic which in combination with the computer system causes or programs computer system 800 to be a special-purpose machine. According to one embodiment, the techniques herein are performed by computer system 800 in response to processor(s) 804 executing one or more sequences of one or more instructions contained in main memory 806. Such instructions may be read into main memory 806 from another storage medium, such as storage device 810. Execution of the sequences of instructions contained in main memory 806 causes processor(s) 804 to perform the process steps described herein. In alternative embodiments, hard-wired circuitry may be used in place of or in combination with software instructions.

The term "non-transitory media," and similar terms, as used herein refers to any media that store data and/or instructions that cause a machine to operate in a specific fashion. Such non-transitory media may comprise non-volatile media and/or volatile media. Non-volatile media includes, for example, optical or magnetic disks, such as storage device 810. Volatile media includes dynamic memory, such as main memory 806. Some forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH memory, NVRAM, any other memory chip or cartridge, and networked versions of the same. The non-transitory media can also include any special-purpose circuits or circuits that can be configured for the special purpose, such as FPGAs and ASICs.

Non-transitory media is distinct from but may be used in conjunction with transmission media. Transmission media participates in transferring information between non-transitory media. For example, transmission media includes coaxial cables, copper wire and fiber optics, including the wires that comprise bus 802. Transmission media can also take the form of acoustic or light waves, such as those generated during radio-wave and infra-red data communications.

The computer system 800 also includes a communication interface 818 coupled to bus 802. Network interface 818 provides a two-way data communication coupling to one or more network links that are connected to one or more local networks. For example, communication interface 818 may be an integrated services digital network (ISDN) card, cable modem, satellite modem, or a modem to provide a data communication connection to a corresponding type of telephone line. As another example, network interface 818 may be a local area network (LAN) card to provide a data communication connection to a compatible LAN (or WAN component to communicated with a WAN). Wireless links may also be implemented. In any such implementation, network interface 818 sends and receives electrical, electromagnetic or optical signals that carry digital data streams representing various types of information.

A network link typically provides data communication through one or more networks to other data devices. For example, a network link may provide a connection through local network to a host computer or to data equipment operated by an Internet Service Provider (ISP). The ISP in turn provides data communication services through the world wide packet data communication network now commonly referred to as the "Internet." Local network and Internet both use electrical, electromagnetic or optical signals that carry digital data streams. The signals through the various networks and the signals on network link and through communication interface 818, which carry the digital data to and from computer system 800, are example forms of transmission media.

The computer system 800 can send messages and receive data, including program code, through the network(s), network link and communication interface 818. In the Internet example, a server might transmit a requested code for an application program through the Internet, the ISP, the local network and the communication interface 818.

The received code may be executed by processor 804 as it is received, and/or stored in storage device 810, or other non-volatile storage for later execution.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system 800.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

In the present disclosure, use of the term "a," "an", or "the" is intended to include the plural forms as well, unless the context clearly indicates otherwise. Also, the term "includes," "including," "comprises," "comprising," "have," or "having" when used in this disclosure specifies the presence of the stated elements, but do not preclude the presence or addition of other elements.

What is claimed is:

1. A computer-implemented method comprising:
   providing, to a network of memristors, a first problem to be solved, the first problem corresponding with a curve for which a global minimum is previously determined;
   gradually providing, to the network of memristors, a second problem to be solved that comprises incrementally solving for individual ones of a set of local minima to find the global minimum that is previously determined, wherein controlled noise is applied to the network of memristors for at least a portion of time during which the second problem is provided to the network of memristors,
   wherein the second problem is gradually introduced to the first problem according to an adiabatic annealing process that reduces a compute time on the network of memristors for solving the second problem; and
   determining a solution to the second problem.

2. The computer-implemented method of claim 1, further comprising:
   solving the first problem to determine an initial condition for the second problem.

3. The computer-implemented method of claim 1, wherein the second problem is associated with a Hamiltonian, and wherein the method further comprises:
   splitting the Hamiltonian associated with the second problem into at least a first Hamiltonian and a second Hamiltonian.

4. The computer-implemented method of claim 3, further comprising:
   controlling at least one of the first Hamiltonian or the second Hamiltonian with one or more gates to prevent influence of the first Hamiltonian or the second Hamiltonian on the solution.

5. The computer-implemented method of claim 3, further comprising:
   updating the first Hamiltonian based on received real-time data, wherein the second Hamiltonian is not updated based on the received real-time data.

6. The computer-implemented method of claim 3, further comprising:
   updating the second Hamiltonian based on received real-time data, wherein the first Hamiltonian is not updated based on the received real-time data.

7. The computer-implemented method of claim 1, further comprising:
   dividing the second problem into subsets, wherein each subset of the subsets is associated with a corresponding problem size, and
   wherein gradually providing the second problem to be solved to the network of memristors comprises:
   providing each subset of the subsets to the network of memristors in an order of increasing problem size.

8. The computer-implemented method of claim 1, further comprising:
   dividing the second problem into subsets, wherein each subset of the subsets is associated with a corresponding problem complexity, and
   wherein gradually providing the second problem to be solved to the network of memristors comprises:
   providing each subset of the subsets to the network of memristors in an order of increasing problem complexity.

9. The computer-implemented method of claim 1, wherein the second problem is gradually introduced to the first problem that involves a transition from the first problem to the second problem, and wherein the second problem is not introduced when the first problem is introduced.

10. The computer-implemented method of claim 1, wherein the second problem is gradually introduced to the first problem in accordance with formula:

$$P = \frac{1}{t_{ann} - t_0}[P_1(t_{ann} - t_k) + P_2(t_k - t_0)], \text{ for } t_0 < t_k < t_{ann}$$

where $t_0$ is an initial time at which the second problem is introduced, $t_{ann}$ is a transition completion time, and $t_k$ is a time in between the initial time and the transition completion time.

11. The computer-implemented method of claim 1, further comprising:
   before gradually introducing the second problem to the first problem, applying a noise profile to an energy profile associated with the first problem, wherein the noise profile illustrates different levels of perturbations on the network of memristors at different times.

12. The computer-implemented method of claim 1, further comprising:
   before gradually introducing the second problem to the first problem, increasing a noise level associated with the first problem that transitions the network of memristors from a solution state to the first problem.

13. A system comprising:
    at least one processor; and
    a memory storing instructions that, when executed by the at least one processor, cause the system to perform a method comprising:
        providing, to a network of memristors, a first problem to be solved, the first problem corresponding with a curve for which a global minimum is previously determined;
        gradually providing, to the network of memristors, a second problem to be solved that comprises incrementally solving for individual ones of a set of local minima to find the global minimum that is previously determined, wherein controlled noise is applied to the network of memristors for at least a portion of time during which the second problem is provided to the network of memristors,
        wherein the second problem is gradually introduced to the first problem according to an adiabatic annealing process that reduces a compute time on the network of memristors for solving the second problem; and
        determining a solution to the second problem.

14. The system of claim 13, wherein the instructions cause the system to perform the method further comprising:
    solving the first problem to determine an initial condition for the second problem.

15. The system of claim 13, wherein the second problem is associated with a Hamiltonian, and wherein the method further comprises:
    splitting the Hamiltonian associated with the second problem into at least a first Hamiltonian and a second Hamiltonian.

16. The system of claim 15, wherein the instructions cause the system to perform the method further comprising:
    controlling at least one of the first Hamiltonian or the second Hamiltonian with one or more gates to prevent influence of the first Hamiltonian or the second Hamiltonian on the solution.

17. A non-transitory computer-readable storage medium including instructions that, when executed by at least one processor of a computing system, cause the computing system to perform a method comprising:
    providing, to a network of memristors, a first problem to be solved, the first problem corresponding with a curve for which a global minimum is previously determined;
    gradually providing, to the network of memristors, a second problem to be solved that comprises incrementally solving for individual ones of a set of local minima to find the global minimum that is previously determined, wherein controlled noise is applied to the network of memristors for at least a portion of time during which the second problem is provided to the network of memristors,
    wherein the second problem is gradually introduced to the first problem according to an adiabatic annealing process that reduces a compute time on the network of memristors for solving the second problem; and
    determining a solution to the second problem.

18. The non-transitory computer-readable storage medium of claim 17, wherein the instructions cause the computing system to perform the method further comprising:
    solving the first problem to determine an initial condition for the second problem.

19. The non-transitory computer-readable storage medium of claim 17, wherein the second problem is associated with a Hamiltonian, and wherein the method further comprises:
    splitting the Hamiltonian associated with the second problem into at least a first Hamiltonian and a second Hamiltonian.

20. The non-transitory computer-readable storage medium of claim 19, wherein the instructions cause the computing system to perform the method further comprising:
    controlling at least one of the first Hamiltonian or the second Hamiltonian with one or more gates to prevent influence of the first Hamiltonian or the second Hamiltonian on the solution.

* * * * *